(12) United States Patent
Nuutinen

(10) Patent No.: US 7,091,818 B2
(45) Date of Patent: Aug. 15, 2006

(54) NOISE SUPPRESSOR UNIT FOR A POWER SOURCE MODULE

(75) Inventor: Sami Nuutinen, Santa Rosa, CA (US)

(73) Assignee: Nokia Networks Oy, Espoo (FI)

( * ) Notice: Subject to any disclaimer, the term of this patent is extended or adjusted under 35 U.S.C. 154(b) by 195 days.

(21) Appl. No.: 09/905,197

(22) Filed: Jul. 16, 2001

(65) Prior Publication Data

US 2002/0053135 A1    May 9, 2002

Related U.S. Application Data

(63) Continuation of application No. PCT/FI00/00289, filed on Apr. 4, 2000.

(30) Foreign Application Priority Data

Apr. 7, 1999   (FI) .................................... 990765

(51) Int. Cl.
*H01F 27/28* (2006.01)

(52) U.S. Cl. .................... 336/229; 336/221; 336/65; 29/595; 29/609.1

(58) Field of Classification Search ............... 29/700, 29/605, 606, 602.1, 739, 33 K, 832; 336/69, 336/70, 83, 92, 185, 192, 208, 224; 333/175, 333/176, 177; 379/415; 361/760–761
See application file for complete search history.

(56) References Cited

U.S. PATENT DOCUMENTS

| | | | | |
|---|---|---|---|---|
| 4,623,865 A * | 11/1986 | Kiesel et al. | .................. | 336/65 |
| 4,656,450 A * | 4/1987 | Jarosz et al. | .................. | 336/83 |
| 4,888,571 A * | 12/1989 | Kobayashi et al. | ........... | 336/65 |
| 5,307,041 A | 4/1994 | Kato et al. | | |
| 5,309,130 A | 5/1994 | Lint | | |
| 5,386,206 A * | 1/1995 | Iwatani et al. | .............. | 336/200 |
| 5,568,111 A | 10/1996 | Metsler | | |
| 5,913,551 A * | 6/1999 | Tsutsumi et al. | ............. | 29/605 |
| 6,513,230 B1* | 2/2003 | Inoue et al. | .................. | 29/606 |
| 6,879,236 B1* | 4/2005 | Nuutinen | .................... | 336/229 |
| 2002/0053135 A1* | 5/2002 | Nuutinen | .................... | 29/700 |

FOREIGN PATENT DOCUMENTS

| | | |
|---|---|---|
| JP | 5-38852 U | 5/1993 |
| JP | 5299252 | 12/1993 |
| JP | 6325943 | 11/1994 |

(Continued)

OTHER PUBLICATIONS

WO 01/05202 Publication Jan. 18, 2001.*

*Primary Examiner*—Minh Trinh
(74) *Attorney, Agent, or Firm*—Pillsbury Winthrop Shaw Pittman LLP

(57) ABSTRACT

The invention relates to a noise suppressor unit for installing a common mode choke for a noise suppressor in a power source module onto a circuit board of the power source module, the module being arranged onto a circuit board of a plug-in unit. The noise suppressor unit includes a holder onto which the common mode choke for the noise suppressor of the power source module is arranged, at least one lifting element for an assembly head or the like of an automatic assembly machine for placing the noise suppressor unit onto the circuit board of the power source module with the automatic assembly machine or the like, and at least one surface mounting element for surface mounting the common mode choke for the noise suppressor onto the circuit board of the power source module.

14 Claims, 4 Drawing Sheets

| | FOREIGN PATENT DOCUMENTS | | | JP | 10294225 | 11/1998 |
|---|---|---|---|---|---|---|
| JP | 7-86047 | * | 3/1995 | | | |
| JP | 8288147 | | 11/1996 | * cited by examiner | | |

NOISE SUPPRESSOR UNIT FOR A POWER SOURCE MODULE

This application is a Continuation of International Application PCT/FI00/00289 filed 4 Apr. 2000 which designated the U.S. and was published under PCT Article 21(2) in English.

BACKGROUND OF THE INVENTION

The invention relates to a noise suppressor unit for installing and mounting a common mode choke for a noise suppressor in a power source module onto a circuit board of the power source module, the module being arranged onto a circuit board of a plug-in unit, wherein the noise suppressor unit comprises a holder having a bottom surface and onto which holder the common mode choke for the noise suppressor of the power source module is arranged, at least one lifting element for an assembly head or the like of an automatic assembly machine for placing the noise suppressor unit onto the circuit board of the power source module with the automatic assembly machine or the like, and at least one surface mounting element for surface mounting the common mode choke for the noise suppressor onto the circuit board of the power source module.

A power source module is a separate current delivery device positioned onto a circuit board of a plug-in unit, the device comprising a circuit board for the power source module. Owing to the structure, which comprises two stacked circuit boards, the power source module only allows the use of especially low components in order for the combination to fit into the card slot reserved for it.

The operation of a power source causes much electromagnetic noise.

The European Commission EMC directive (89/336/EEC) on electric devices determines which devices must not be disturbed by other devices and which must not disturb other devices.

In the current and future telecommunications community, the fulfilment of the requirements of the directives is of utmost importance, and also constitutes a competitive advantage. If electromagnetic noise cannot be filtered in the power source module, it propagates and may cause malfunction in the plug-in unit. As a result of this, the operation of the entire system may be disturbed.

For this reason, for preventing the propagation of noise, the interface between the power source and the plug-in unit may comprise a noise filter having, among other things, a common mode choke for a noise suppressor of the power source module. The operation of the noise filter is reciprocal.

Common mode chokes for noise suppressors in power source modules have previously been disposed on the circuit board of a plug-in unit.

Common mode chokes for noise suppressors in power source modules have previously been manually positioned onto the circuit board of the plug-in unit, and the ends of the choke coils have been soldered into openings on the circuit board of the plug-in unit.

When components are assembled onto a circuit board by modern production methods, the above-described conventional method cannot be used. A common mode choke for a noise suppressor in a power source module has to be able to be assembled automatically and surface mounted.

Such packages are commercially available that allow automated assembly and surface mounting of a common mode choke for a noise suppressor in a power source module, but owing to the two-piece holder+cover structure of the packages, the components become too high, and exceed the maximum height allowed for power source modules. One such coil component is disclosed in U.S. Pat. No. 5,307,041.

BRIEF DESCRIPTION OF THE INVENTION

The invention relates to a noise suppressor unit for installing a common mode choke for a noise suppressor in a power source module onto a circuit board of the power source module, the module being arranged onto a circuit board of a plug-in unit, for solving the above problems.

The objects of the invention are achieved by a noise suppressor unit which is characterized by what is stated in the independent claims. The preferred embodiments of the noise suppressor unit of the invention are disclosed in the dependent claims.

The solution of the invention allows placing the common mode choke for the noise suppressor of the power source module onto the holder so as to achieve a noise suppressor unit which can be positioned onto the circuit board of the power source module by an automatic assembly machine and in which the common mode choke for the noise suppressor of the power source module can be surface mounted onto the circuit board of the power source module by means of surface mounting elements.

The solution of the invention allows the common mode choke for the noise suppressor of the power source module to be positioned directly onto the circuit board of the power source module. The advantages gained by the modification are significant. Noise can be filtered where it is created, i.e. in the power source module.

Power source modules can be constructed as completely independent units that the designer of the plug-in unit can connect to the plug-in unit without other external components.

The solution of the invention has various uses.

As components are assembled onto the circuit board, the holder of the noise suppressor unit acts as a transfer holder for the common mode choke for the noise suppressor of the power source module. The holder of the noise suppressor unit comprises a lifting element from which an automatic assembly machine can transfer the noise suppressor unit for example from a component palette to the circuit board of the power source module. The lifting element comprises preferably a grip surface for the assembly head or the like of the automatic assembly machine, the grip surface being located farther away from the bottom surface of the holder than does the outermost point seen from the bottom surface of the holder of the common mode choke for the noise suppressor of the power source module, from which grip surface the strainer of the assembly machine can transfer the noise suppressor unit from the component palette onto the circuit board of the power source module. If the lifting element has a substantially even lower grip surface and the holder a substantially even bottom surface, and they are substantially parallel, then the bottom surface of the holder of the noise suppressor unit can be easily positioned in parallel with the circuit board of the power source module at the assembly stage of the noise suppressor unit.

The surface mounting elements in the noise suppressor unit enable surface mounting of the common mode choke for the noise suppressor of the power source module.

Furthermore, the temperature of the common mode choke for the noise suppressor of the power source module rises in use, and the noise suppressor unit of the invention allows it to be efficiently cooled. The use of a large number of surface mounting elements, for example eight, and/or a wide cross-section thereof, allow the common mode choke for the noise suppressor of the power source module to be efficiently cooled since the surface mounting elements efficiently transfer the heat caused by the choke to the cooling layers of the circuit board of the power source module. Efficient cooling enables the use of the noise suppressor unit in high-power applications.

In the solution of the invention, the height of the components does not present a problem since the power source module can be made low and the surface mounting feet of the surface mounting elements can be embedded in the bottom surface of the holder.

BRIEF DESCRIPTION OF THE FIGURES

In the following the invention will be described in greater detail in connection with preferred embodiments with reference to the attached drawings, in which FIG. 1 schematically shows a power source module.

DETAILED DESCRIPTION OF THE INVENTION

Figure 1:
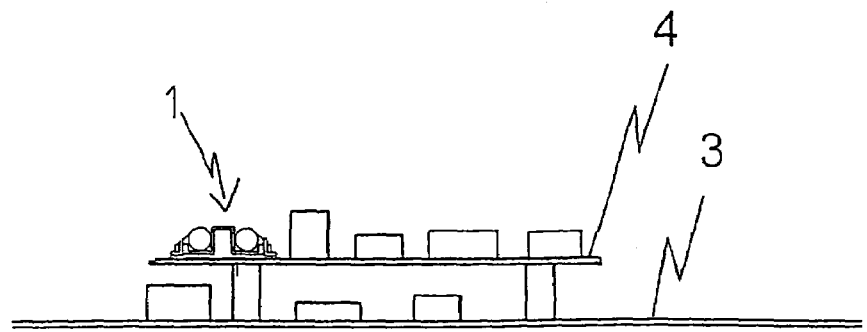
Figure 2:
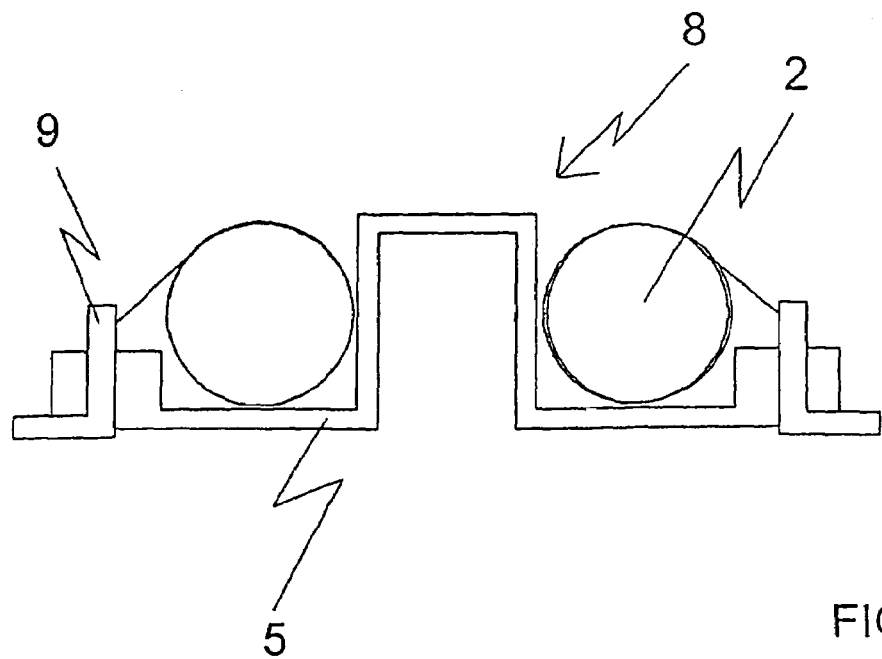
FIG. 2 is a schematic side view of a noise suppressor unit of the invention.
Figure 3:
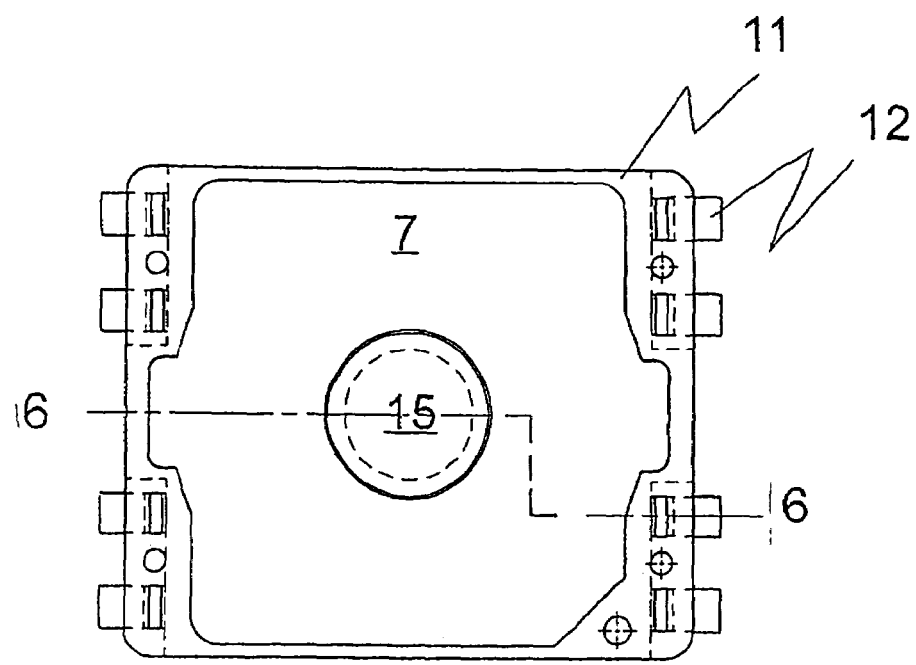
FIG. 3 is a top view of the holder of a noise suppressor unit.
Figure 4:
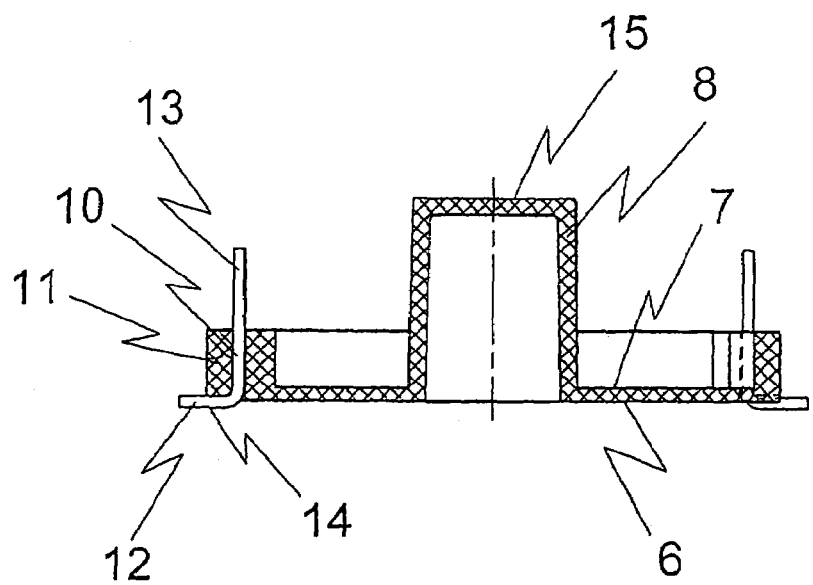
FIG. 4 is a side view of the holder of a noise suppressor unit.
Figure 5:
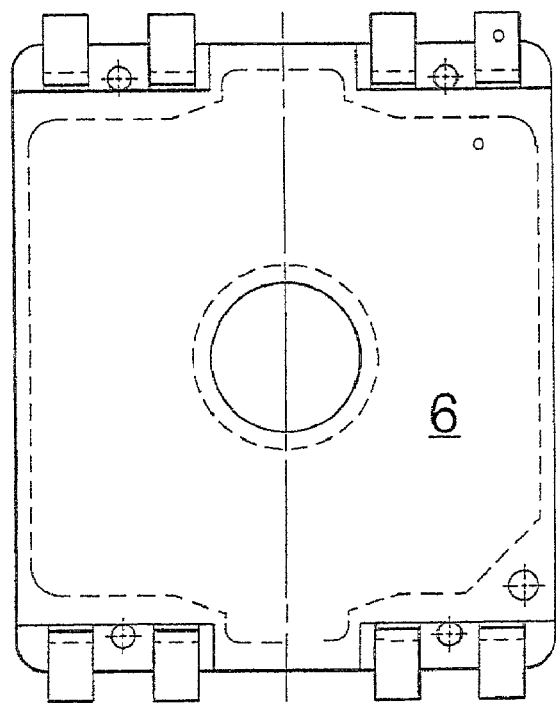
FIG. 5 is a bottom view of the holder of a noise suppressor unit.
Figure 6:
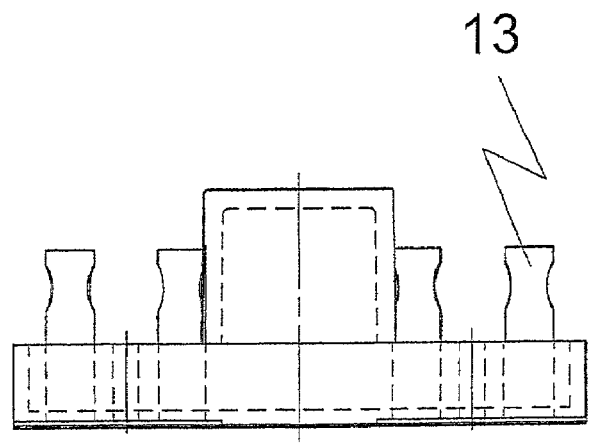
FIG. 6 is a side view of the holder of a noise suppressor unit taken along line 6—6(FIG. 3)
Figure 7:
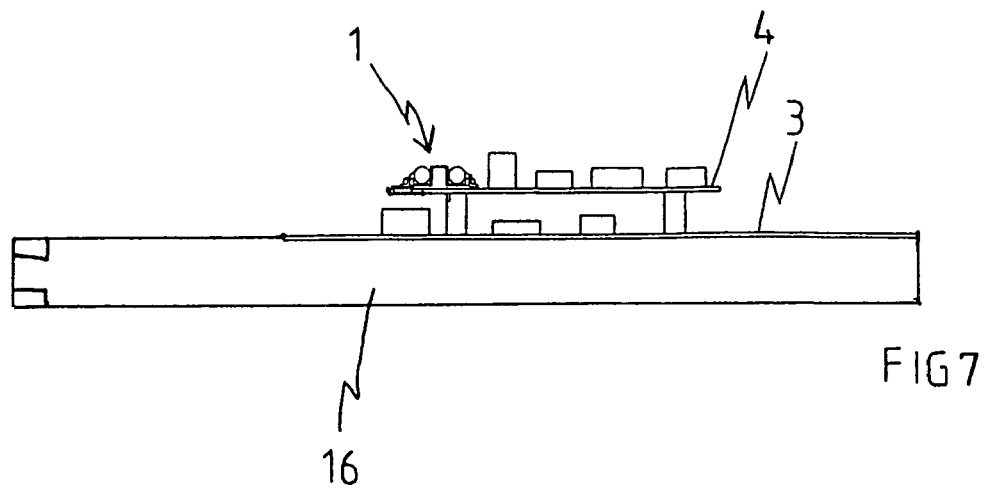
FIG. 7 is a schematic side view of a plug-in unit having a power source module.
Figure 8:
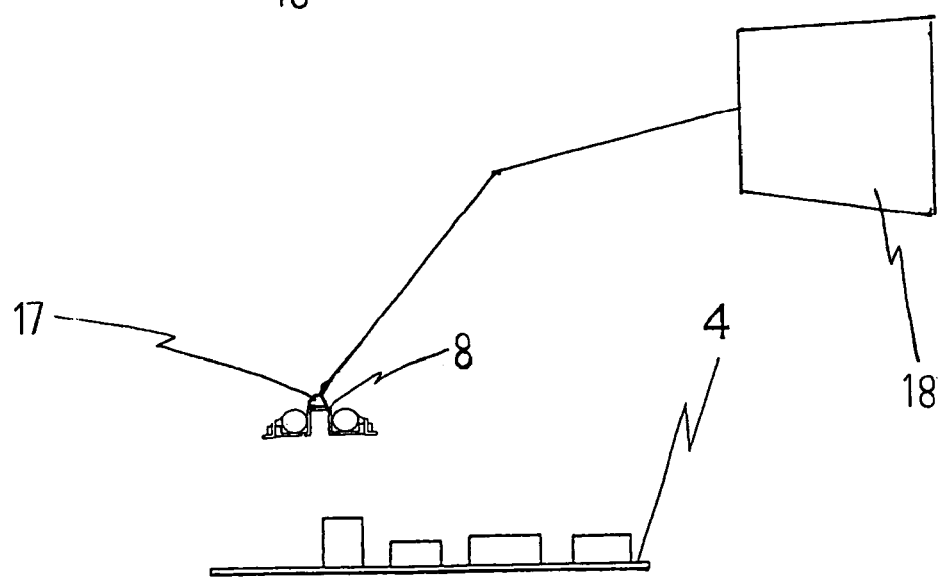
FIG. 8 shows mounting of a noise suppressor unit onto a power source module.

FIG. 1 schematically shows a noise suppressor unit 1 of the invention for installing a common mode choke 2 for a noise suppressor in a power source module onto a circuit board 3 of a plug-in unit 16 arranged onto a circuit board 4 of the power source module.

In addition to the common mode choke 2 for the noise suppressor of the power source module, the noise suppressor unit 1 comprises, among other things, means for coupling the common mode choke 2 for the noise suppressor of the power source module to the circuit board 4 of the power source module. The operation of such a common mode choke 2 for a noise suppressor in a power source module is known per se, and therefore not described in any greater detail herein.

The noise suppressor unit 1 comprises a holder 5, upon which the common mode choke 2 for the noise suppressor of the power source module is arranged. The holder 5 may be made of plastic, for example.

The holder 5 shown in the figures comprises a bottom surface 6, which, during the assembly, faces the circuit board 4 of the power source module, and a top surface 7 on the opposite side of the bottom surface 6. In the figures, the bottom surface 6 is substantially even. In the figures, the top surface 7 of the holder is also substantially even.

The noise suppressor unit 1 comprises at least one lifting element 8 for the assembly head 17 or the like of an automatic assembly machine 18 for placing the noise suppressor unit 1 onto the circuit board 4 of the power source module by the automatic assembly machine or the like (not shown).

The noise suppressor unit 1 comprises at least one surface-mounting element 9 for surface mounting the common mode choke 2 for the noise suppressor of the power source module onto the circuit board 4 of the power source module. The noise suppressor unit 1 shown in the figures comprises eight surface mounting elements 9. The surface mounting elements 9 are made from some electrically conductive, surface mountable material.

At least one surface mounting element 9 is preferably arranged into an opening 10 in the holder 5 to make the surface mounting element 9 extend through the holder 5. The opening 10 is preferably so dimensioned and designed that it supports the surface mounting elements 9 and keeps them fixed in the opening 10.

The holder 5 shown in the figures comprises a ridge 11 which projects from the top surface 7 of the holder 5 and is provided with the openings 10. The ridge 11 serves for example to protect the common mode choke 2 for the noise suppressor of the power source module particularly at the assembly stage of the noise suppressor unit of the invention.

At least one surface mounting element 9 preferably comprises a surface mounting foot 12 for mounting the surface mounting element 9 to the circuit board 4 of the power source module, and a mounting head 13 to which the common mode choke 2 for the noise suppressor of the power source module is coupled.

Each of the surface mounting elements 9 shown in the figures comprises a surface mounting foot 12 by means of which the surface mounting element 9 can be mounted to the circuit board 4 of the power source module, and a mounting head 13 which extends from the top surface 7 of the holder 5 and to which the common mode choke 2 for the noise suppressor of the power source module is coupled.

There are preferably several surface mounting feet 12, for example eight, and they have preferably a large cross-sectional area so as to achieve efficient cooling of the noise suppressor, since thermal energy can be efficiently transferred along the surface mounting elements 9 to the circuit board 4 of the power source module.

Preferably at least one surface mounting foot 12 is at least partially embedded in the bottom surface 6. Such an arrangement provides a low noise suppressor unit.

The surface mounting feet 12 shown in the figures have a substantially even mounting surface 14, which is substantially parallel to the bottom surface 6. Such an arrangement provides a good contact between the noise suppressor unit 1 and the circuit board 4 of the power source module, and provides a low noise suppressor unit.

The noise suppressor unit 1 of the figures comprises only one lifting element 8. The lifting element 8 preferably projects from the top surface 7 of the holder 5. The lifting element 8 preferably projects substantially from the middle of the top surface 7 of the holder 5.

The lifting element 8 is preferably an elevation which projects from the top surface 7 of the holder 5.

The lifting element 8 preferably comprises a grip surface 15 for the assembly head or the like of the automatic assembly machine, the grip surface 15 being located farther away from the holder 5 than the outermost point of the common mode choke 2 for the noise suppressor of the power source module.

The invention also relates to a method of installing and mounting a common mode choke 2 for a noise suppressor in a power source module onto a circuit board 4 of the power source module, the module being arranged onto a circuit board 3 of a plug-in unit.

The method employs a noise suppressor unit 1 comprising a holder 5 upon which the common mode choke 2 for the noise suppressor of the power source module is arranged. The noise suppressor unit 1 is positioned onto the circuit board 4 of the power source module by an automatic assembly machine or the like, by means of at least one lifting element 8 for an assembly head or the like arranged in the noise suppressor unit 1. The common mode choke 2 for the noise suppressor of the power source module is surface mounted to the circuit board 4 of the power source module by means of at least one surface mounting element 9 in the noise suppressor unit 1.

The grip surface 15 of the lifting element 8 is preferably substantially even, making it easier to grab for example with a strainer (not shown) at the assembly head of an automatic assembly machine.

The bottom surface 6 of the holder 5 and the grip surface 15 of the lifting element 8 are preferably substantially parallel.

It is obvious to those skilled in the art that as technology advances, the basic idea of the invention may be implemented in a variety of ways. Accordingly, the invention and its embodiments are not restricted to the above-described examples, but may vary with the scope of the claims.

The invention claimed is:

1. A noise suppressor unit for a power source module, the power source module being arranged onto a circuit board, wherein the noise suppressor unit comprises
   a common mode choke,
   a holder for holding the common mode choke, said holder having a bottom surface and a top surface, and at least one lifting element, said lifting element being an elevation which projects substantially from a middle of the top surface of the holder, said lifting element projecting through the common mode choke and including a grip surface being located further away from the holder than the outermost point of the common mode choke, and
   at least one surface mounting element for surface mounting the noise suppressor onto the circuit board of the power source module.

2. The noise suppressor unit as claimed in claim 1, wherein the lifting element is a lifting element for an assembly head of an automatic assembly machine.

3. The noise suppressor unit as claimed in claim 1, wherein the bottom surface of the holder is substantially even.

4. The noise suppressor unit as claimed in claim 1, wherein at least one surface mounting element is arranged in an opening in the holder so that the surface mounting element extends at least from the bottom surface of the holder to a top surface of the holder on one side of the bottom surface of the holder.

5. The noise suppressor unit as claimed in claim 1, wherein at least one surface mounting element comprises a mounting head to which the common mode choke for the noise suppressor of the power source module is coupled.

6. The noise suppressor unit as claimed in claim 1, wherein at least one surface mounting element comprises a surface mounting foot for mounting the surface mounting element to the circuit board of the power source module and the mounting foot is at least partially embedded in the bottom surface of the holder.

7. The noise suppressor unit as claimed in claim 1,
   wherein the bottom surface of the holder is substantially even,
   wherein at least one surface mounting element comprises a surface mounting foot for mounting the surface mounting element to the circuit board of the power source module, and a mounting head to which the common mode choke for the noise suppressor of the power source module is coupled, and
   wherein the mounting foot comprises a mounting surface which is substantially parallel to the bottom surface of the holder.

8. The noise suppressor unit as claimed in claim 1, wherein the grip surface of the lifting element is substantially even.

9. The noise suppressor unit as claimed in claim 1, wherein the grip surface of the lifting element is substantially even and the bottom surface of the holder is substantially even, and wherein the bottom surface of the holder and the grip surface of the lifting element are substantially parallel.

10. A noise suppressor unit for a power source module, the power source module being arranged onto a circuit board, the noise suppressor unit comprising:
    a common mode choke and a holder for holding the common mode choke, the holder having a bottom surface and a top surface,
    means for lifting the noise suppressor unit, wherein the means for lifting is part of the holder, and the means for lifting comprises an elevation which projects from the top surface of the holder and through the common mode choke, the means for lifting further including means for griping located further away from the holder than an outermost point of the common mode choke, and
    means for surface mounting the noise suppressor onto the circuit board of the power source module.

11. The noise suppressor unit of claim 10, wherein the means for surface mounting comprises a surface mounting foot for mounting the means for surface mounting to the circuit board of the power source module.

12. The noise suppressor unit of claim 11, wherein the surface mounting foot is at least partially embedded in the bottom surface of the holder.

13. The noise suppressor unit of claim 10, wherein the means for surface mounting comprises means for coupling the common mode choke for the noise suppressor of the power source module.

14. The noise suppressor unit of claim 10, wherein
    the bottom surface of the holder is substantially even, and
    the means for surface mounting comprises a surface mounting foot for mounting the means for surface mounting to the circuit board of the power source module, and means for coupling the common mode choke for the noise suppressor of the power source module, and wherein the mounting foot comprises a mounting surface which is substantially parallel to the bottom surface of the holder.

* * * * *